United States Patent
Park et al.

(10) Patent No.: US 8,570,796 B2
(45) Date of Patent: Oct. 29, 2013

(54) NONVOLATILE MEMORY CELL, NONVOLATILE MEMORY DEVICE AND METHOD FOR DRIVING THE SAME

(75) Inventors: Hae-Chan Park, Gyeonggi-do (KR); Gap-Sok Do, Gyeonggi-do (KR); Jang-Uk Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/619,672

(22) Filed: Sep. 14, 2012

(65) Prior Publication Data
US 2013/0039123 A1    Feb. 14, 2013

Related U.S. Application Data

(62) Division of application No. 12/492,820, filed on Jun. 26, 2009, now Pat. No. 8,289,761.

(30) Foreign Application Priority Data

May 19, 2009   (KR) .................... 10-2009-0043653

(51) Int. Cl.
    *G11C 11/00*    (2006.01)

(52) U.S. Cl.
    USPC .............................. 365/163; 365/148; 365/113

(58) Field of Classification Search
    USPC ........................................ 365/163, 148, 113
    See application file for complete search history.

(56) References Cited

U.S. PATENT DOCUMENTS

2008/0083943 A1*   4/2008   Walker .......................... 257/315

OTHER PUBLICATIONS

Notice of Allowance issued by the USPTO for a divisional U.S. Appl. No. 13/619,771 of the parent U.S. Appl. No. 12/492,820 on Apr. 1, 2013.

* cited by examiner

*Primary Examiner* — Jason Lappas
(74) *Attorney, Agent, or Firm* — IP & T Group LLP

(57) ABSTRACT

A nonvolatile memory cell is able to reduce the size per the unit area by employing a dual gate structure where the chalcogenide compound is used for a channel. The nonvolatile memory cell includes a phase-change layer, a first and a second gate that are in contact with sides of the phase-change layer to face each other across the phase-in change layer and control a current flowing through the phase-change layer by each gate being arranged to induce the phase transition of the phase-change layer independently of the other.

20 Claims, 21 Drawing Sheets

NONVOLATILE MEMORY CELL, NONVOLATILE MEMORY DEVICE AND METHOD FOR DRIVING THE SAME

CROSS-REFERENCE TO RELATED APPLICATIONS

This application is a division of U.S. patent application Ser. No. 12/492,820 filed on Jun. 26, 2009, which claims priority of Korean Patent Application No. 10-2009-0043653 filed on May 19, 2009. The disclosure of each of the foregoing applications is incorporated herein by reference in its entirety.

BACKGROUND OF THE INVENTION

The present invention relates to semiconductor fabricating technology, and more particularly, to a nonvolatile memory cell including a dual gate using a phase-change material for a channel, a nonvolatile memory device and a method for driving the same.

In general, semiconductor memory devices may be classified into volatile memory devices such as a dynamic random access memory (DRAM) device and a static random access memory (SRAM) device and nonvolatile memory devices such as a flash memory device and an electrically erasable programmable read-only memory (EEPROM) device according to whether or not the memory device maintains data stored in memory cells even when power to the device is turned off.

Among the nonvolatile memory devices, the flash memory device is being widely used in electronic instruments such as a digital camera, a cellular phone and an MPEG audio layer-3 (MP-3). However, the flash memory device requires a large amount of time when writing data or reading out stored data. Therefore, instead of the flash memory device, there have been developed new semiconductor devices such as a magnetic random access memory (MRAM) device, a ferroelectric random access memory (FRAM) device and a phase-change random access memory (PRAM) device.

The PRAM device, which is referred to as a phase-change memory device hereinafter, has an amorphous state or a polycrystalline state according to phase transition of a chalcogenide compound constructing its phase-change layer and stores data using the difference between resistances of the above two states. That is, the phase-change memory device stores data with a logic value '0' or '1' using reversible phase-change of a phase-change layer formed of germanium-antimony-tellurium (Ge—Sb—Te, GST) that is the chalcogenide compound according to amplitude and length of a pulse supplied thereto. For instance, if a reset pulse (reset current) is supplied thereto, the phase-change layer melts away and thus becomes a high resistance state of the amorphous state, i.e., a reset state '1'. Meanwhile, if a set pulse (set current) is supplied thereto, the phase-change layer becomes a low resistance state of the polycrystalline state, i.e., a set state '0'.

FIG. 1 illustrates a cross-sectional view of a conventional phase-change memory device.

Referring to FIG. 1, a transistor including a gate electrode 14 and source and drain regions 16-1 and 16-2 is formed in a substrate 10 including an isolation layer 11. Furthermore, a first inter-layer insulation layer 17 is formed on the substrate 10 and first via contacts 18 respectively connected to the source and drain regions 16-1 and 16-2 are formed in the first inter-layer insulation layer 17. Herein, the gate electrode 14 of the transistor acts as a word line of the phase-change memory device.

First metal lines 19 respectively connected to the first via contacts 18 are formed on the first inter-layer insulation layer 17. Moreover, a second inter-layer insulation layer 20 is formed on the first inter-layer insulation layer 17. A second via contact 21 connected to the first metal line 19 is formed in the second inter-layer insulation layer 20. A phase-change layer 22 connected to the second via contact 21 is formed on the second inter-layer insulation layer 20.

A third inter-layer insulation layer 23 is formed on the second inter-layer insulation layer 20 to cover the phase-change layer 22. A third via contact 24 connected to the phase-change layer 22 is formed in the third inter-layer insulation layer 23. A second metal line 25 connected to the third via contact 24 is formed on the third inter-layer insulation layer 23. Herein, the second metal line 25 acts as a bit line of the phase-change memory device.

For illustration purposes, a reference numeral '12' represents a gate insulation layer; a reference numeral '13' indicates a gate conductive layer; and a reference numeral '15' presents a spacer formed on a sidewall of the gate electrode 14, wherein the gate electrode 14 includes the gate insulation layer 12 and the gate conductive layer 13 that are vertically stacked.

In the conventional phase-change memory device described above, a unit cell includes the transistor, i.e., a cell transistor, and the phase-change layer 22. Accordingly, in each of unit cells, at least one first via contact 18 is required to connect the drain region 16-2 and ground (GND). As a result, the size of the unit cell increases. Meanwhile, the phase transition of the phase-change layer 22 is caused by heat from conducting electricity provided from the second via contact 21 that is a lower electrode. Thus, a large amount of a reset current is required to induce the phase transition of the phase-change layer 22, which increases the channel width of the cell transistor, so that it is difficult to implement a high density memory cell array.

SUMMARY OF THE INVENTION

An embodiment of the present invention is directed to providing a nonvolatile memory cell capable of reducing the size per the unit area by employing a dual gate structure where the chalcogenide compound is used for a channel.

Another embodiment of the present invention is directed to providing a nonvolatile memory cell whose size per the unit area is reduced by employing a dual gate structure where the chalcogenide compound is used for a channel, and a method for driving the same.

Still another embodiment of the present invention is directed to providing a nonvolatile memory device capable of enhancing a degree of integration by employing a dual gate structure where the chalcogenide compound is used for a channel.

Further still another embodiment of the present invention is directed to providing a method for driving a nonvolatile memory device whose degree of integration is enhanced by employing a dual gate structure where the chalcogenide compound is used for a channel.

Further still another embodiment of the present invention is directed to providing a nonvolatile memory device whose degree of integration is enhanced by stacking nonvolatile memory strings including a plurality of nonvolatile memory cells to form a vertical structure.

In accordance with an aspect of the present invention, there is provided a nonvolatile memory cell including: a phase-change layer; a first and a second gate that are in contact with sides of the phase-change layer to face each other across the phase-change layer and control a current flowing through the phase-change layer by each gate being arranged to induce the phase transition of the phase-change layer independently of the other gate.

In accordance with another aspect of the present invention, there is provided a method for driving a nonvolatile memory cell, the method including: a data writing step of writing data by supplying a reset current or a set current to a first gate; a pre-readout step of supplying the reset current to a second gate; and a readout step of reading out the data by detecting a state of a readout current supplied to a phase-change layer.

In accordance with another aspect of the present invention, there is provided a nonvolatile memory device including: a channel line formed of a phase-change material; and a plurality of first word lines and a plurality of second word lines that are in contact with a channel line to face each other across the channel line and control a current flowing through the channel line by each word line being arranged to induce the phase transition in surrounding regions of the channel line independently of the other word lines, wherein the first and second word lines are in contact with the channel line in the surrounding regions.

In accordance with another aspect of the present invention, there is provided a method for driving a nonvolatile memory device, the method including: a data writing step of writing data by supplying a reset current or a set current to a selected first word line; a pre-readout step of supplying the reset current to a second word line facing to the selected first word line; and a readout step of reading out the data by supplying a readout current to a bit line connected to a channel line.

In accordance with another aspect of the present invention, there is provided a nonvolatile memory device including: a plurality of first switching elements and a plurality of second switching elements formed over a substrate; a first inter-layer dielectric layer formed to cover the first and second switching elements; a plurality of second word lines locally formed over the first inter-layer dielectric layer; a second inter-layer dielectric layer formed over the first inter-layer dielectric layer to expose the top surface of the second word lines; a channel line formed over the first inter-layer dielectric layer to be in contact with the second word lines; and a plurality of first word lines formed over the channel line to correspond to the second word lines.

In accordance with another aspect of the present invention, there is provided a nonvolatile memory device including: a plurality of channel lines that is formed of a phase-change material and is divided from each other to form a stack structure over a substrate; and a plurality of first word lines and a plurality of second word lines disposed to face each other with the channel line forming a boundary therebetween.

DESCRIPTION OF SPECIFIC EMBODIMENTS

Figure 1:
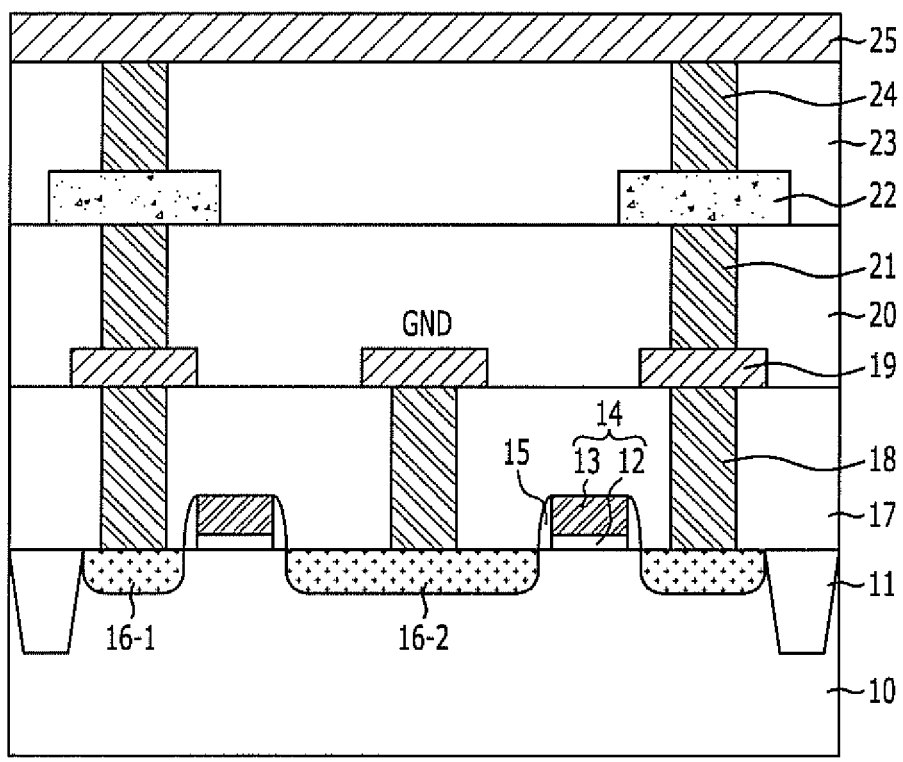
FIG. 1 illustrates a cross-sectional view of a conventional phase-change memory device.

Other objects and advantages of the present invention can be understood by the following description, and become apparent with reference to the embodiments of the present invention.

Referring to the drawings, the illustrated thickness of layers and regions are exemplary and may not be exact. When a first layer is referred to as being "on" a second layer or "on" a substrate, it could mean that the first layer is formed directly on the second layer or the substrate, or it could also mean that a third layer may exist between the first layer and the substrate. Furthermore, the same or like reference numerals represent the same or like constituent elements, even if they appear in different embodiments or drawings of the present invention.

Figure 2:
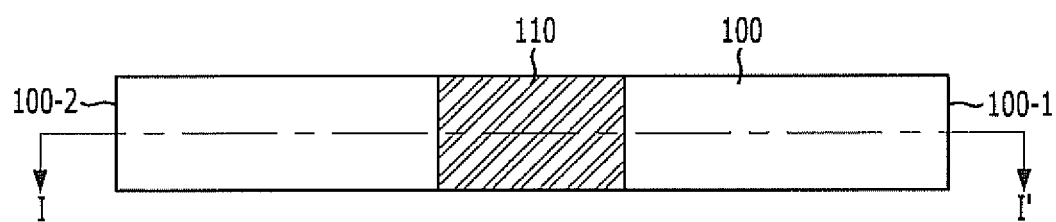
FIG. 2 illustrates a plane view of a nonvolatile memory cell in accordance with an embodiment of the present invention.
Figure 3:
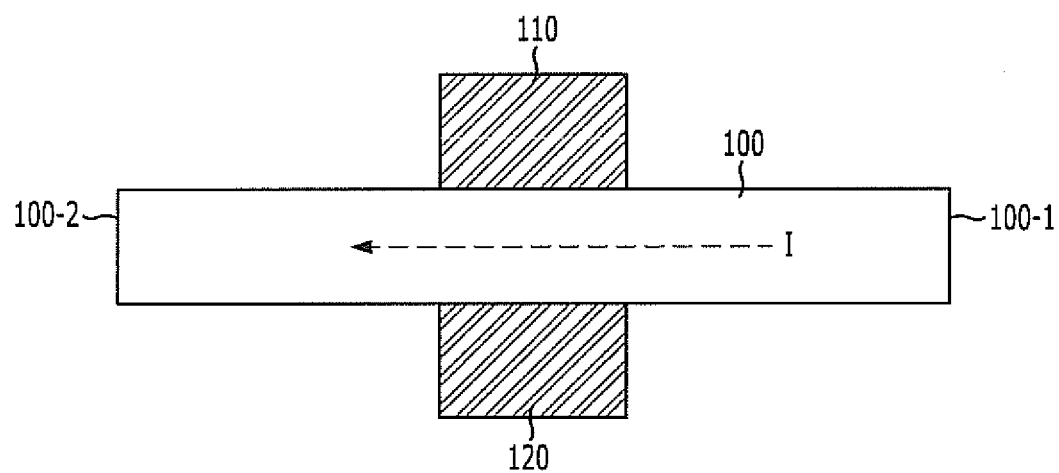
FIG. 3 illustrates a cross-sectional view taken along a line I-I' described in FIG. 2.

FIG. 2 illustrates a plane view of a nonvolatile memory cell in accordance with an embodiment of the present invention. FIG. 3 illustrates a cross-sectional view taken along a line I-I' described in FIG. 2.

Referring to FIGS. 2 and 3, the nonvolatile memory cell in accordance with the embodiment of the present invention includes a phase-change layer 100 and a first and a second gate 110 and 120 implementing a dual gate structure.

The phase-change layer 100 is formed of a phase-change material. Herein, the phase-change material means a material whose crystalline state is changed to an amorphous state or a polycrystalline state by heat supplied thereto. For instance, the phase-change material uses germanium-antimony-tellurium (Ge—Sb—Te, GST) that is the chalcogenide compound. However, the phase-change material in accordance with the present invention is not limited thereto. Any material whose crystalline state is changed by heat and which shows a relatively high or low resistance characteristic according to the changed crystalline state may be used as the phase-change material.

For example, the phase-change material used in the present invention may include one selected from a group comprising the compound of two elements such as GaSb, InSb, InSe, $Sb_2Te_3$ and GeTe, the compound of three elements such as GeSbTe, GaSeTe, InSbTe, $SnSb_2Te_4$, $InSb_2Te_4$ and InSbGe, and the compound of four elements such as AgInSbTe, (GeSn)SbTe, GeSb(SeTe) and $Te_{81}Ge_{15}Sb_2S_2$.

The first and second gates 110 and 120 are disposed to face each other using the phase-change layer 100 as the boundary therebetween and have a symmetric structure with respect to the phase-change layer 100. For instance, in the cross-sectional view illustrated in FIG. 3, the first gate 110 is disposed at an upper side of the phase-change layer 100 and the second gate 120 is disposed at a lower side of the phase-change layer 100. However, the arrangement of the first and second gates 110 and 120 is not limited thereto. For example, the first and second gates 110 and 120 may be disposed at the same level/plane as that of the phase-change layer 100. That is, the first and second gates 110 and 120 may be disposed at left and right sides of the phase-change layer 100.

The first and second gates 110 and 120 are respectively in contact with the phase-change layer 100 and change the crystalline state of the phase-change layer 100 using heat generated by currents supplied thereto. That is, the crystalline state of the phase-change layer 100 is changed by heat transferred from the first and second gates 110 and 120. Therefore, it is preferable that the first and second gates 110 and 120 are formed of materials having high resistivity to sufficiently generate heat, so that it is possible to use reduced currents supplied thereto in generating required heat, i.e., a reset current and a set current.

Meanwhile, the conventional phase-change memory device described in FIG. 1 performs a data readout operation through a current path formed by the third via contact 24, the phase-change layer 22 and the second via contact 21. That is, the current path for the data readout is formed in a vertical direction. Therefore, there are limitations in increasing the resistivity of the second via contact 21, which is the lower electrode. Namely, in case of increasing the resistivity of the second via contact 21, a characteristic of a current flowing through the phase-change layer 22 may induce a malfunction of the device since the phase-change layer 22 shows the same characteristic as that of the amorphous state even if the phase-change layer 22 is in the polycrystalline state by the high resistivity of the second via contact 21 when performing the data readout operation. Thus, the conventional phase-change memory device has a problem that the reset current cannot be reduced due to the limitations in increasing the resistivity of the second contact via 21.

As described above, the first and second gates 110 and 120 are in contact with sides of the phase-change layer 100 to face each other across the phase-change layer 100. The first gate 110 is in contact with one side of the phase-change layer 100 and the second gate 120 is in contact with the other side of the phase-change layer 100. Herein, 'one side' and 'the other side' represent sides that face each other vertically.

It is preferable to design an area where the first gate 110 is in contact with the phase-change layer 100 to be substantially the same as an area where the second gate 120 is in contact with the phase-change layer 100. However, it is also within the scope of the invention to design the area where the first gate 110 is in contact with the phase-change layer 100 to be different from the area where the second gate 120 is in contact with the phase-change layer 100. As long as the first and second gates 110 and 120 have contact areas so that the phase transition of the phase-change layer 100 can be fully achieved in a region corresponding to the first and second gates 110 and 120 by heat generated by the reset currents respectively supplied to the first and second gates 110 and 120, any design of the first and second gate areas are within the scope of the invention. In the foregoing manner, a current I flowing through a first end 100-1 and a second end 100-2 of the phase-change layer 100 can be controlled.

The current I flowing through the phase-change layer 100 flows along a direction perpendicular to the direction that the first and second gates 110 and 120 face each other with respect to the phase-change layer 100. That is, in case where the first and second gates 110 and 120 are disposed in a vertical direction at the upper and lower sides of the phase-change layer 100 as being in contact with the phase-change layer 100 as illustrated in FIG. 3, the current I flows from the first end 100-1 to the second end 100-2 horizontally.

Hereinafter, a method for driving the nonvolatile memory cell in accordance with the embodiment of the present invention will be described.

Figure 4:
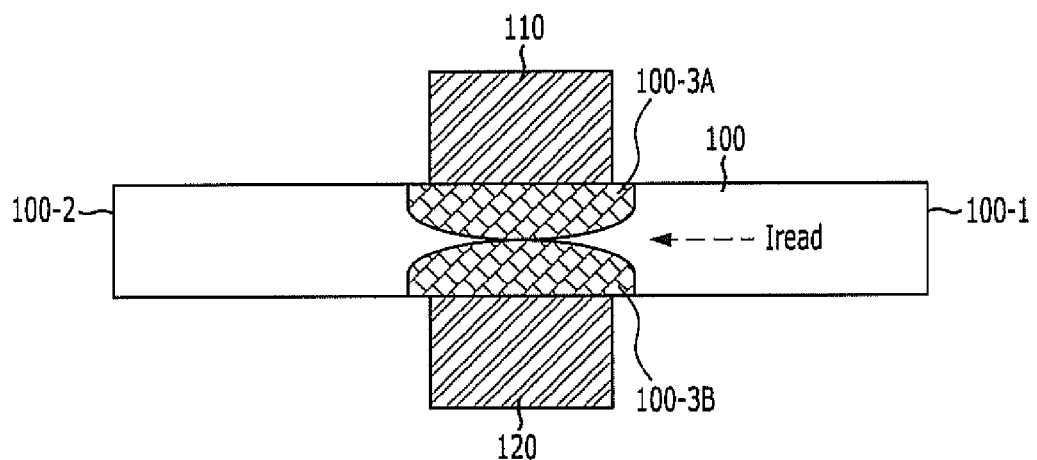
FIGS. 4 and 5 illustrate cross-sectional views showing a method for driving the nonvolatile memory cell in accordance with the embodiment of the present invention.
Figure 5:
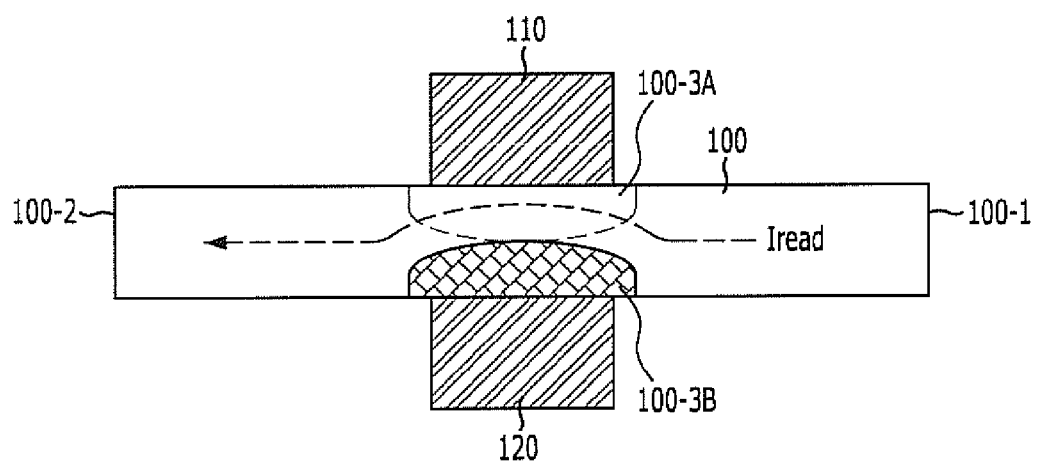
Figure 6:
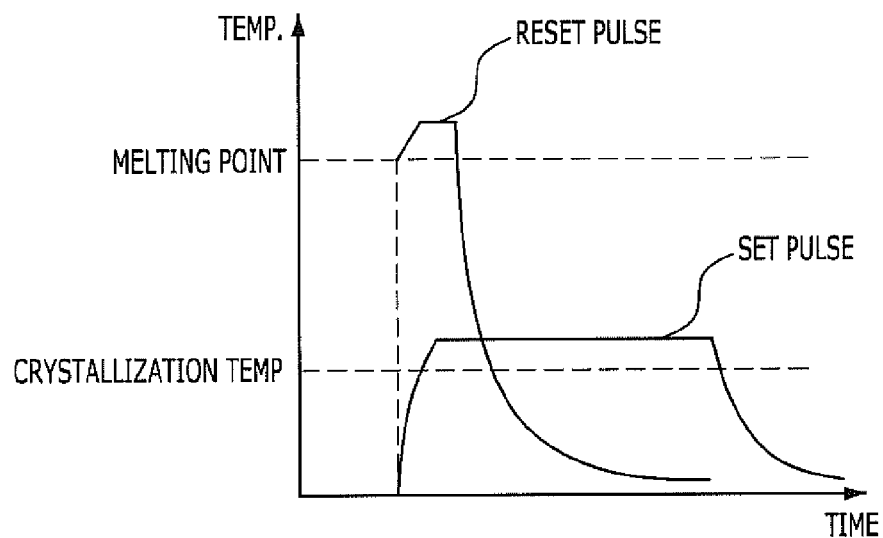
FIG. 6 illustrates a reset pulse and a set pulse used in the embodiment of the present invention.

FIG. 4 illustrates a cross-sectional view for explaining a reset state '1' of the nonvolatile memory cell; FIG. 5 illustrates a cross-sectional view for explaining a set state '0' of the nonvolatile memory cell; and FIG. 6 illustrates a reset pulse and a set pulse used in the embodiment of the present invention.

Referring to FIG. 4, the phase-change layer 100 maintains an initial polycrystalline state. In this initial state, if the reset current is supplied to the first and second gates 110 and 120, surrounding regions 100-3A and 100-3B of the phase-change layer 100 that are in contact with the first and second gates 110 and 120, respectively, are changed from the polycrystalline state to the amorphous state and thus show the high resistance characteristic. Accordingly, a readout current Iread having a value corresponding to the high resistance characteristic is outputted since the current flowing from the first end 100-1 to the second end 100-2 is blocked. A state having the high resistance characteristic is referred to as the reset state and represented by a logic value '1'. That is, in the high resistance state, data '1' is stored.

Referring to FIG. 5, as described in FIG. 4, in a condition that the phase-change layer 100 maintains the polycrystalline state, if the set current is supplied to the first gate 110 and the reset current is supplied to the second gate 120, the phase transition does not occur in the surrounding region 100-3A of the phase-change layer 100 that is in contact with the first gate 110 and thus the surrounding region 100-3A maintains the polycrystalline state, whereas the phase transition occurs in the surrounding region 100-3B of the phase-change layer 100 that is in contact with the second gate 120 and thus the surrounding region 100-3B is changed from the polycrystalline state to the amorphous state. That is, the phase transition occurs only in the surrounding region 100-3B of the phase-change layer 100 that is in contact with the second gate 120, thereby changing the crystalline state of the surrounding region 100-3B to the amorphous state. Therefore, a channel formed in the phase-change layer 100 is not completely closed and the channel is opened in the surrounding region 100-3A. As a result, it shows the low resistance characteristic relatively less than that in FIG. 4. Accordingly, the readout current Iread flows from the first end 100-1 to the second end 100-2 through the surrounding region 100-3A. After all, a value corresponding to the low resistance characteristic is outputted and the value corresponding to the low resistance characteristic is stored. A state having the low resistance characteristic is referred to as the set state and represented by a logic value '0'.

Figure 7:
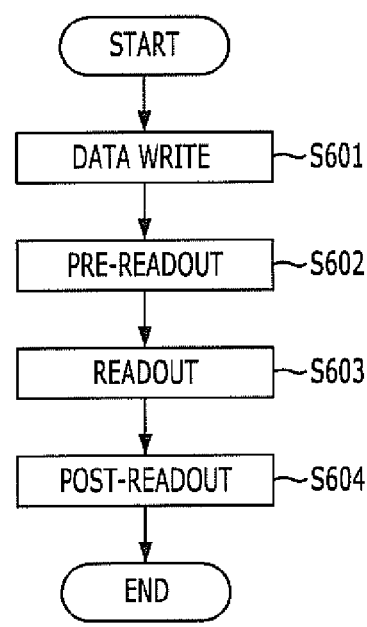
FIG. 7 illustrates a method for driving the nonvolatile memory cell in accordance with the embodiment of the present invention.

FIG. 7 illustrates a method for driving the nonvolatile memory cell in accordance with the embodiment of the present invention.

Referring to FIG. 7, the method for driving the nonvolatile memory cell in accordance with the embodiment of the present invention includes a data write step S601, a pre-readout step S602, and a readout step S603. In addition, the method includes a post-readout step S604 performed after the readout step S603.

Figure 8:
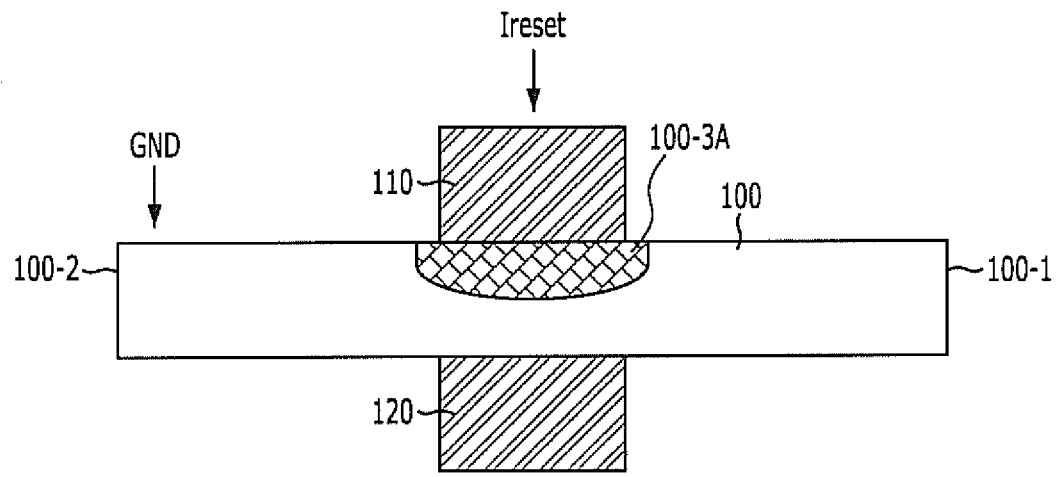
FIGS. 8 to 15 illustrate cross-sectional views showing a method for driving a nonvolatile memory cell in accordance with the embodiment of the present invention.
Figure 9:
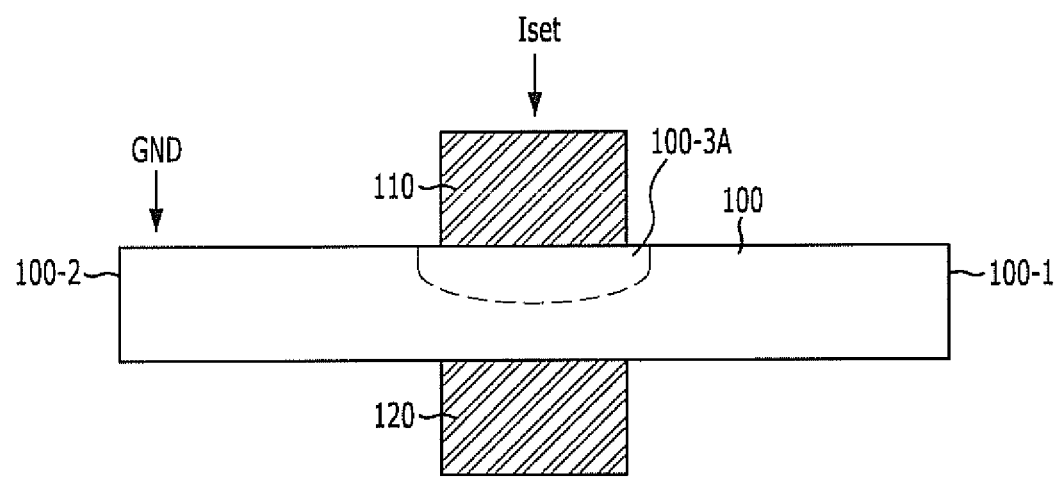

The data write step S601 is performed according to schemes described in FIGS. 8 and 9. FIG. 8 illustrates a cross-sectional view for explaining an operation of writing '1' to the nonvolatile memory cell and FIG. 9 illustrates a cross-sectional view for explaining an operation of writing '0' to the nonvolatile memory cell.

As shown in FIG. 8, a ground voltage GND is supplied to the phase-change layer 100 by connecting the phase-change layer 100 to a ground terminal and a reset current Ireset is supplied to the first gate 110. According to this bias condition, the surrounding region 100-3A of the phase-change layer 100 that is in contact with the first gate 110 is changed from the polycrystalline state to the amorphous state and thus has the high resistance characteristic.

Referring to FIG. 9, as described in FIG. 8, the ground voltage GND is supplied to the phase-change layer 100 by connecting the phase-change layer 100 to the ground terminal and a set current Iset is supplied to the first gate 110. According to this bias condition, the surrounding region 100-3A of the phase-change layer 100 that is in contact with the first gate 110 maintains the polycrystalline state and thus has the low resistance characteristic.

Figure 10:
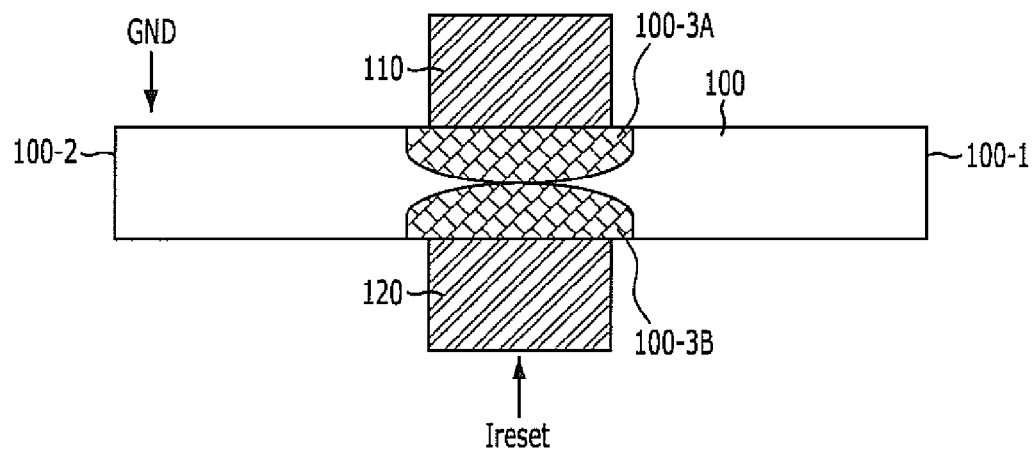

The pre-readout step S602 is explained with reference to FIGS. 10 and 11. FIG. 10 illustrates a cross-sectional view for explaining a method for pre-reading out data from the cell where data '1' is stored in FIG. 8, and FIG. 11 illustrates a cross-sectional view for explaining a method for pre-reading out data from the cell where data '0' is stored in FIG. 9.

Referring to FIG. 10, as described in FIG. 8, in a state that the ground voltage GND is supplied to the phase-change layer 100, the reset current Ireset is supplied to the second gate 120. According to this bias condition, the surrounding region 100-3B of the phase-change layer 100 that is in contact with the second gate 12 is changed from the polycrystalline state to the amorphous state and thus has the high resistance characteristic. At this time, the surrounding region 100-3B in the amorphous state is in contact with the surrounding region 100-3A that is changed to the amorphous state as in FIG. 8 and thus the channel of the phase-change layer 100 is closed in a region corresponding to the first and second gates 110 and 120.

Figure 11:
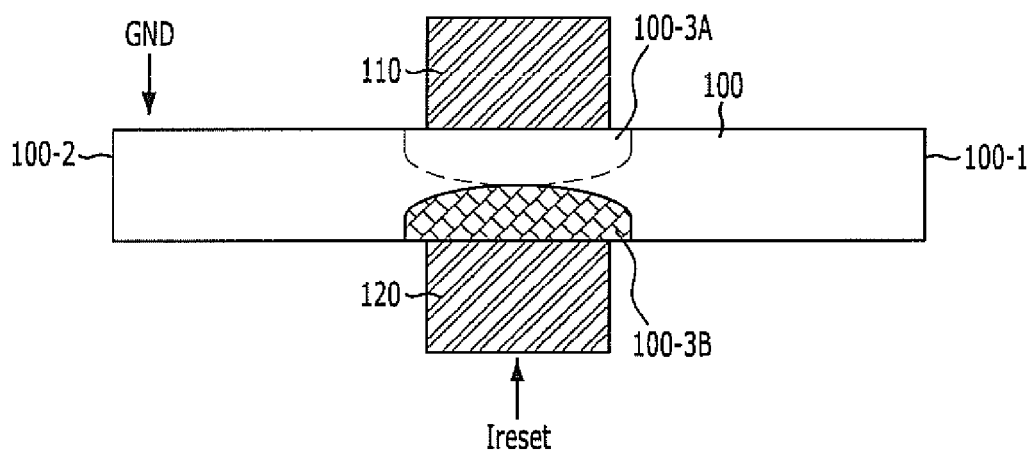

Referring to FIG. 11, as described in FIG. 10, in the state that the ground voltage GND is supplied to the phase-change layer 100, the reset current Ireset is supplied to the second gate 120. According to this bias condition, the surrounding region 100-3B of the phase-change layer 100 that is in contact with the second gate 12 is changed from the polycrystalline state to the amorphous state and thus has the high resistance characteristic. At this time, since the surrounding region 100-3A maintains the polycrystalline state as in FIG. 9, the channel of the phase-change layer 100 is partially opened instead of being completely closed in the region corresponding to the first and second gates 110 and 120.

Figure 12:
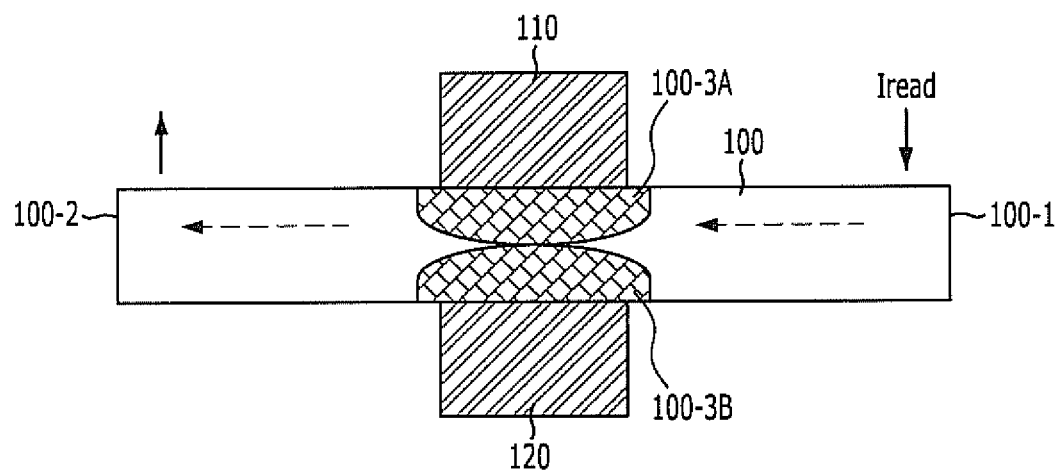

The readout step S603 is described with reference to FIGS. 12 and 13. FIG. 12 illustrates a cross-sectional view for explaining a method for reading out data from the cell where data '1' is stored in FIG. 8, and FIG. 13 illustrates a cross-sectional view for explaining a method for reading out data from the cell where data '0' is stored in FIG. 9.

As shown in FIG. 12, the data is read out by supplying the readout current Iread to the first end 100-1 of the phase-change layer 100 and detecting a current flowing toward the second end 100-2. In FIGS. 8 and 10, the surrounding regions 100-3A and 100-3B of the phase-change layer 100 are changed to the amorphous state and thus the channel of the phase-change layer 100 is completely closed. Therefore, the readout current Iread supplied to the first end 100-1 is blocked without flowing toward the second end 100-2.

Figure 13:
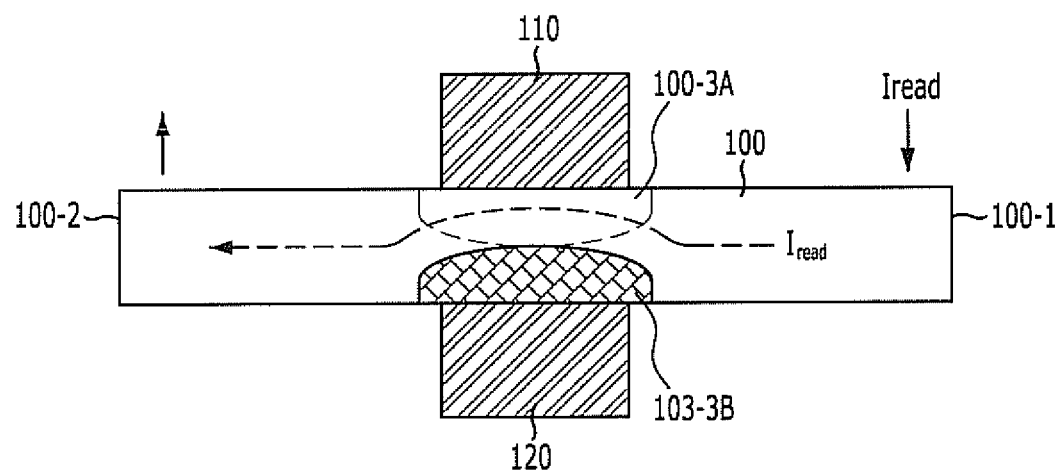

Referring to FIG. 13, as shown in FIG. 12, the data is read out by supplying the readout current Iread to the first end 100-1 of the phase-change layer 100 and detecting a current flowing toward the second end 100-2. In FIGS. 9 and 11, since the surrounding region 100-3A of the phase-change layer 100 is in the polycrystalline state and the surrounding region 100-3B is in the amorphous state, the channel of the phase-change layer 100 is partially opened without being completely closed. Therefore, the readout current Iread supplied to the first end 100-1 flows toward the second end 100-2.

As shown in FIG. 12, in case where the channel of the phase-change layer 100 is completely closed and thus the readout current Iread cannot flow from the first end 100-1 to the second end 100-2, data '1' is read out. On the other hand, as described in FIG. 13, in case where the channel of the phase-change layer 100 is opened and thus the readout current Iread flows from the first end 100-1 to the second end 100-2, data '0' is read out.

Figure 14:
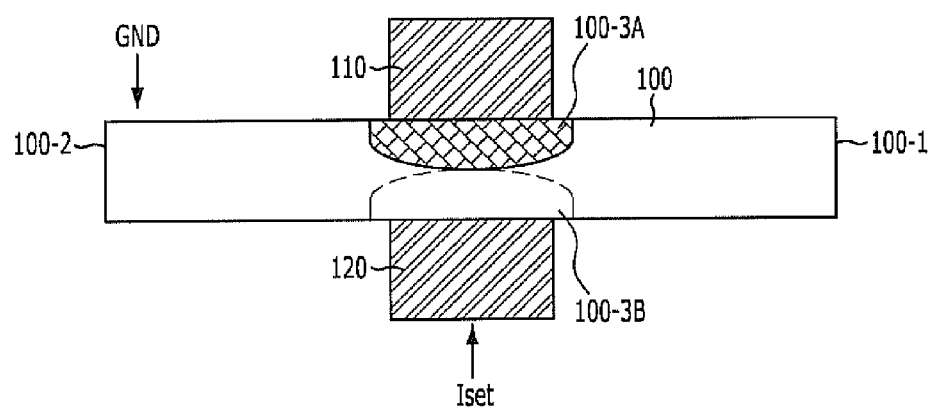
Figure 15:
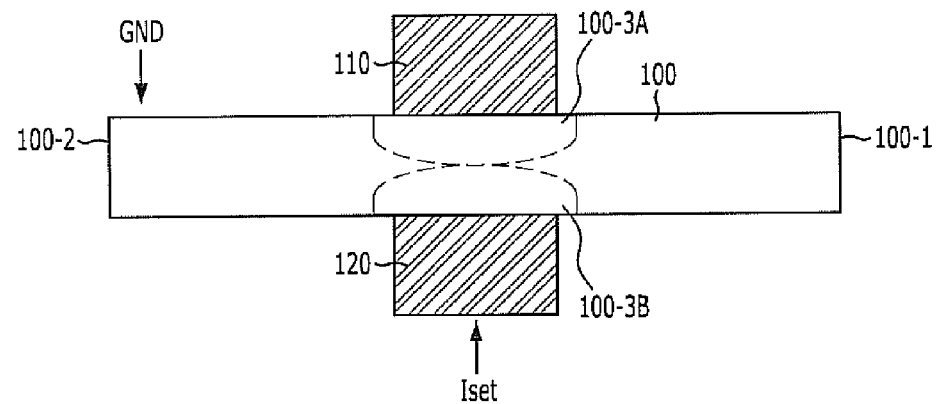

The post-readout step S604 is descried with reference to FIGS. 14 and 15. FIG. 14 illustrates a cross-sectional view for explaining a method for post-reading out data from the cell where data '1' is stored in FIG. 8, and FIG. 15 illustrates a cross-sectional view for explaining a method for post-reading out data from the cell where data '0' is stored in FIG. 9.

As illustrated in FIGS. 14 and 15, the post-readout step S604 is a refresh operation that is performed after the readout step S603 and before the next readout operation. In a state of supplying the ground voltage GND to the phase-change layer 100, the set current Iset is supplied to the second gate 120. According to this bias condition, the surrounding region 100-3B that is in the amorphous state in FIGS. 12 and 13 is changed to the polycrystalline state by the phase transition.

The surrounding region 100-3B whose crystalline state is controlled by the second gate 120 does not participate in the data writing operation practically unlike the surrounding region 100-3A controlled by the first gate 110, and is used as a reference value to verify the data determined by the state of the surrounding region 100-3A. That is, the first gate 110 controls data expected to be written to a cell and the second gate 120 verifies whether the data written to the cell is '1' or '0'.

Figure 16:
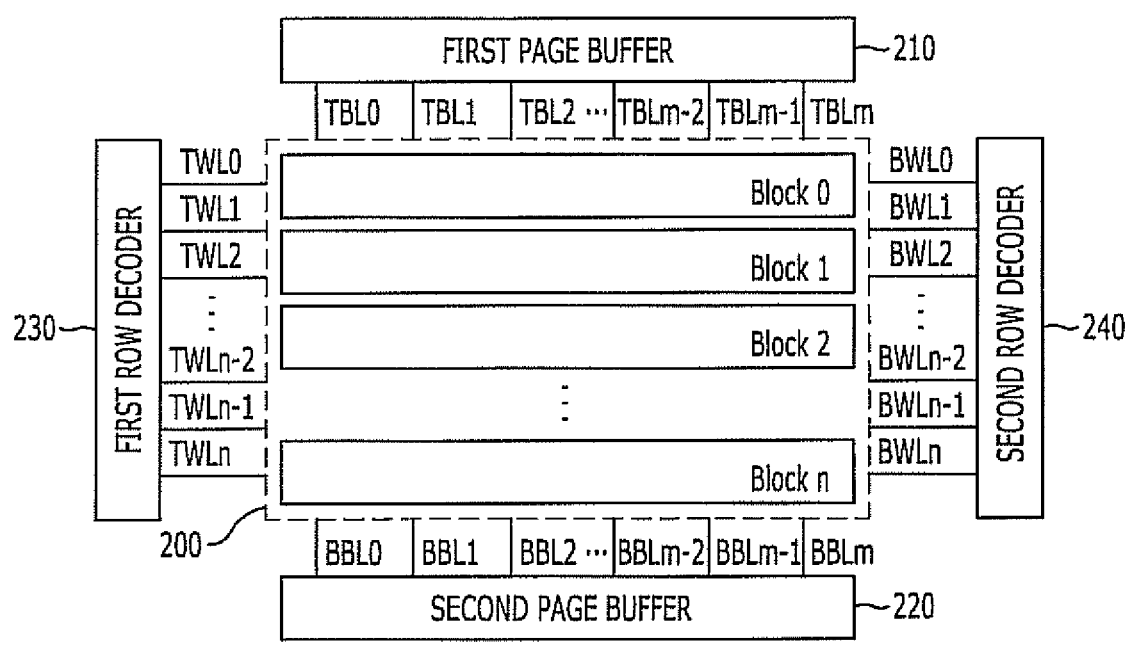
FIG. 16 illustrates a block diagram of a nonvolatile memory device in accordance with an embodiment of the present invention.
Figure 17:
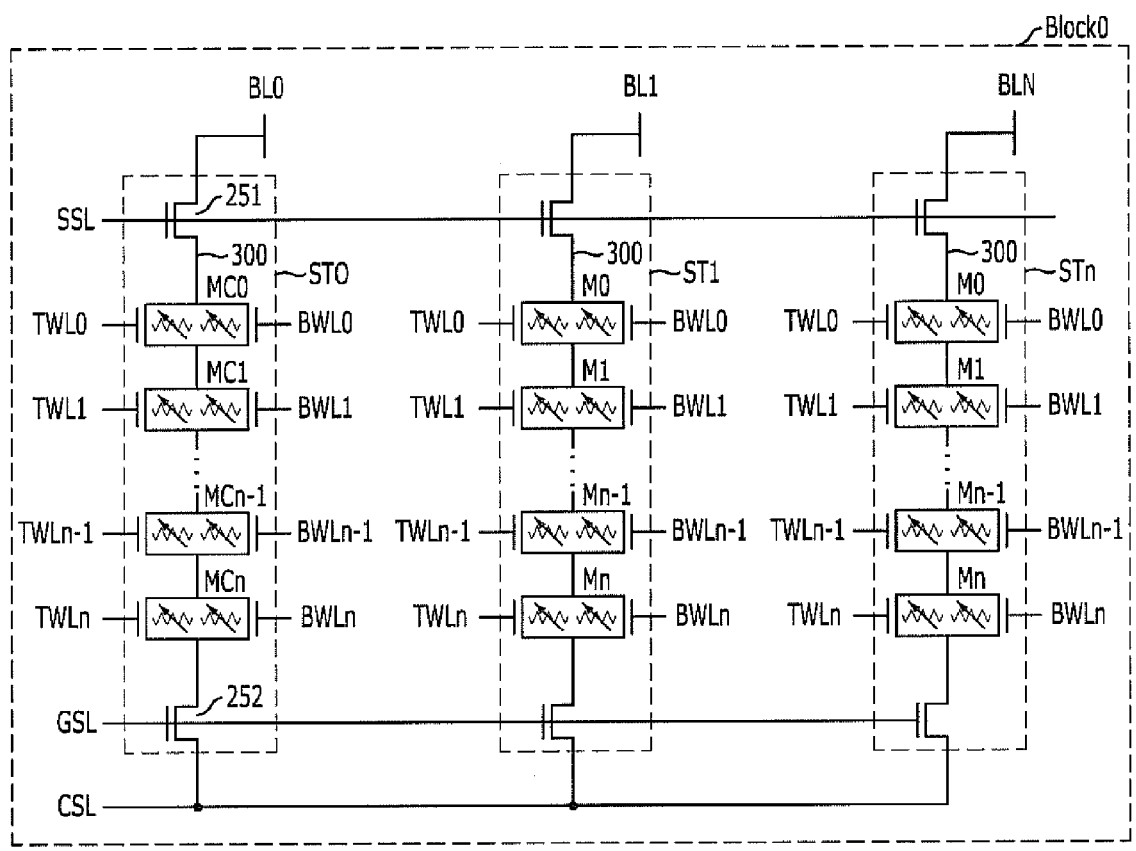
FIG. 17 illustrates an equivalent circuit of a string included in a block described in FIG. 16.

FIG. 16 illustrates a block diagram of a nonvolatile memory device in accordance with an embodiment of the present invention. FIG. 17 illustrates an equivalent circuit of strings ST0 to STn included in a block Block0 among blocks of a memory cell array 200 described in FIG. 16.

Figure 18:
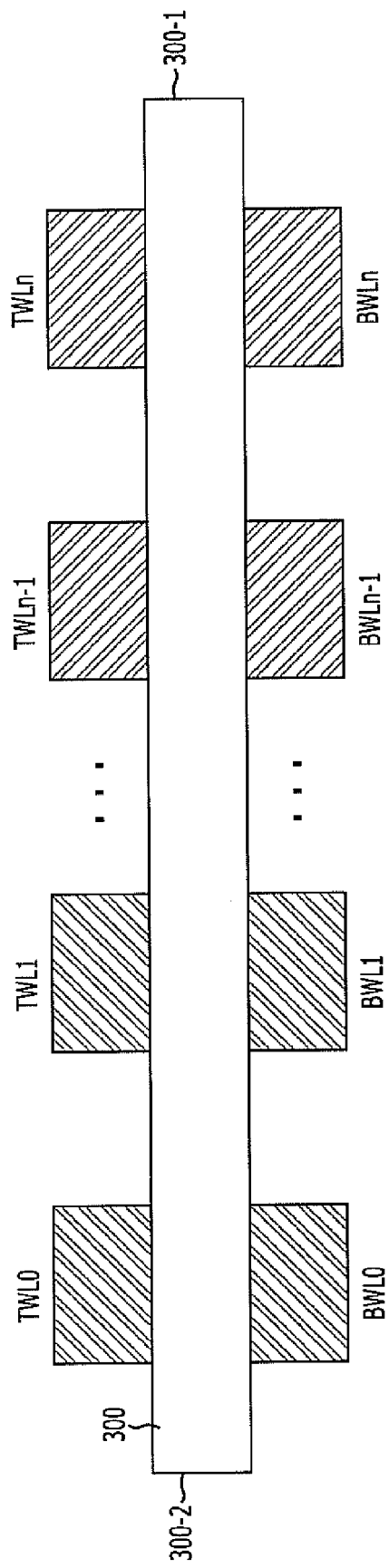
FIG. 18 illustrates a cross-sectional view showing some memory cells in the string described in FIG. 16.

FIG. 18 illustrates a cross-sectional view showing memory cells MC0 to MCn in the string ST0 described in FIG. 16. In this description, 'n' and 'm' are natural numbers.

Referring to FIG. 16, the nonvolatile memory device includes the memory cell array 200, a first and a second page buffer 210 and 220, and a first and a second row decoder 230 and 240.

As shown in FIG. 16, the memory cell array 200 includes a plurality of blocks Block0 to Blockn. The number of the blocks constructing the memory cell array 200 is not limited thereto and may be changed according to design needs. Each of the blocks includes the same number of strings. For instance, each of the blocks includes the plurality of strings ST0 to STn as described in FIG. 17.

Referring to FIG. 17, each of the strings ST0 to STn includes a channel line 300 formed of a phase-change material, and first word lines TWL0 to TWLn and second word lines BWL0 to BWLn each of which controls a current flowing through the channel line 300 by each word line being arranged to induce phase transition of the channel line 300 independently of other word lines, wherein the first word lines TWL0 to TWLn face the second word lines BWL0 to BWLn across the channel line 300.

Referring to FIG. 18, the channel line 300 has a crystalline state that is changed by the phase transition induced by each of the first and second word lines TWL0 to TWLn and BWL0 to BWLn independently of other word lines.

The first and second word lines TWL0 to TWLn and BWL0 to BWLn are disposed to face each other using the channel line 300 as the boundary therebetween, and thus they form a symmetric structure. For instance, in a cross-section described in FIG. 18, the first word lines TWL0 to TWLn are disposed at an upper side of the channel line 300 and the second word lines BWL0 to BWLn are disposed at a lower side of the channel line 300.

The first and second word lines TWL0 to TWLn and BWL0 to BWLn are in contact with the channel line 300 and change the crystalline state of the channel line 300 connected thereto by using heat generated by a current supplied thereto. It is preferable to form the first and second word lines TWL0 to TWLn and BWL0 to BWLn with a material having high resistivity to sufficiently generate necessary heat. Through this, it is possible to obtain an effect of reducing a reset current and a set current supplied to the first and second word lines TWL0 to TWLn and BWL0 to BWLn.

As described in FIG. 17, each of the strings ST0 to STn further includes a first and a second switching element 251 and 252. Each of the first and second switching elements 251 and 252 is constructed of a transistor. For instance, the first and second switching elements 251 and 252 are constructed of NMOS transistors or PMOS transistors, and, preferably, they are constructed of the NMOS transistors.

The first switching element 251 connects a first end 300-1 of the channel line 300 to a bit line BL. The second switching element 252 connects a second end 300-2 of the channel line 300 to a common source line CSL. The first switching element 251 connects the channel line 300 and the bit line BL in response to a selection signal inputted to a string selection line SSL. The second switching element 252 connects the channel line 300 and the common source line CSL in response to a selection signal inputted to a ground selection line GSL.

The first and second page buffers 210 and 220 read out data stored in memory cells. As illustrated in FIG. 16, the first page buffer 210 may be disposed at an upper side of the memory cell array 200 and the second page buffer 220 may be disposed at a lower side of the memory cell array 200. However, the arrangement of the first and second page buffers 210 and 220 is not limited thereto and they may be disposed appropriately by considering effective use of space when designing the layout.

As described in FIG. 16, the reason for separately disposing the first and second page buffers 210 and 220 at the upper and lower sides of the memory cell array 200, respectively, is to enhance a degree of integration by using space effectively. Therefore, the page buffers 210 and 220 may be disposed at the same side of the memory cell array 200 if the layout design does not require so.

In the construction of FIG. 16, the first and second page buffers 210 and 220 include a plurality of unit page buffers and each unit page buffer is connected to one pair of two adjacent bit lines among bit lines TBL0 to TBLm or BBL0 to BBLm. For instance, the first unit page buffer of the unit page buffers included in the first page buffer 210 is connected to the bit lines TBL0 and TBL1 and reads out data from a string connected to the bit lines TBL0 and TBL1. The first unit page buffer of the unit page buffers included in the second page buffer 220 is connected to the bit lines BBL0 and BBL1 and reads out data from a string connected to the bit lines BBL0 and BBL1.

The first and second row decoders 230 and 240 are symmetrically disposed with respect to the memory cell array 200 as described in FIG. 16. However, the arrangement of the first and second row decoders 230 and 240 is not limited thereto. The first and second row decoders 230 and 240 respectively supply a reset current or a set current as appropriately to word lines selected from the first and second word lines TWL0 to TWLn and BWL0 to BWLn. For instance, the first row decoder 230 supplies the reset current or the set current to the first word lines TWL0 to TWLn and the second row decoder 240 supplies the reset current or the set current to the second word lines BWL0 to BWLn.

Hereinafter, a method for driving the nonvolatile memory device in accordance with the embodiment of the present invention will be described.

FIGS. 19 to 22 are views for explaining the method for driving the nonvolatile memory device in accordance with the embodiment of the present invention. As just an example, a method for randomly writing data '1' into the plurality of memory cells constructing the string and reading out the written data is described.

Figure 19:
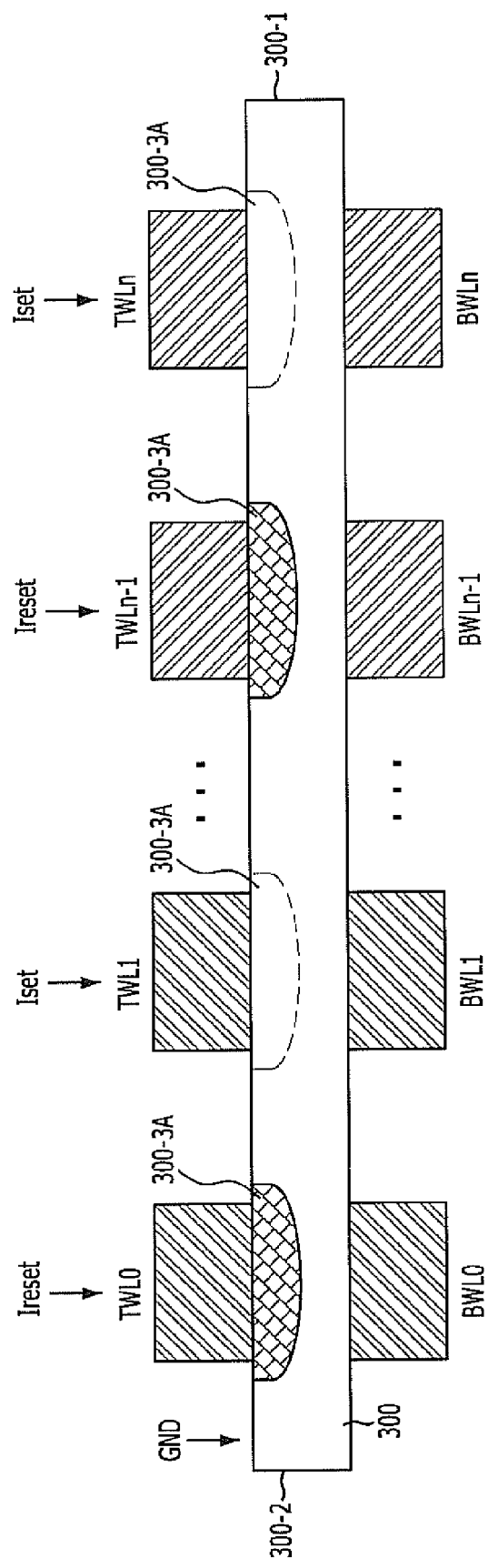
FIGS. 19 to 26 illustrate a method for driving the nonvolatile memory device in accordance with the embodiment of the present invention.

FIG. 19 illustrates a view for explaining a data writing method. As shown in FIG. 19, the ground voltage GND is supplied to the channel line 300 by connecting the channel line 300 to the ground terminal. In this condition, the reset current Ireset is supplied to the first word lines TWL0 and TWLn-1 and the set current Iset is supplied to the first word lines TWL1 and TWLn. According to this bias condition, the phase transition occurs in a surrounding region 300-3A of the channel line 300 neighboring the first word lines TWL0 and TWLn-1 and thus the surrounding region 300-3A of the channel line 300 neighboring the first word lines TWL0 and TWLn-1 is changed from the polycrystalline state to the amorphous state to thereby have the high resistance characteristic. The phase transition does not occur in the surrounding region 300-3A of the channel line 300 neighboring the first word lines TWL1 and TWLn and thus the surrounding region 300-3A of the channel line 300 neighboring the first word lines TWL1 and TWLn maintains its original polycrystalline state to thereby have the low resistance characteristic.

Figure 20:
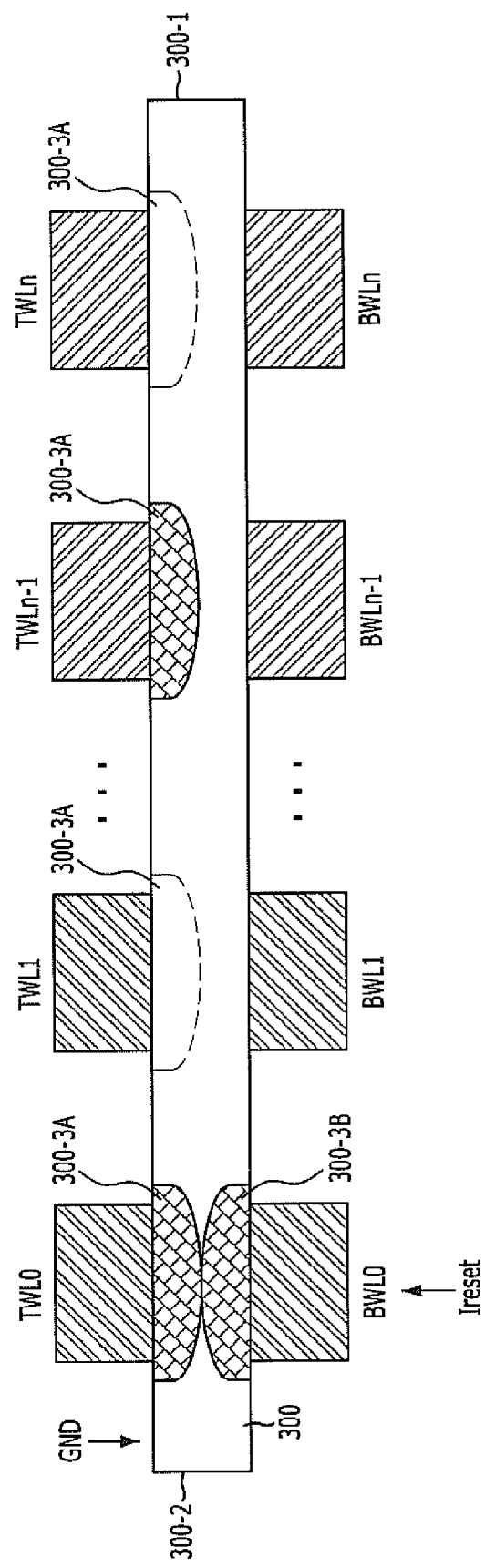

FIG. 20 illustrates a view for explaining a pre-readout method. As an example, a method for pre-reading out data stored in a memory cell corresponding to the first word line TWL0 is described. As illustrated in FIG. 20, the reset current Ireset is supplied to a word line BWL0 among the second word lines BWL0 to BWLn in a state of supplying the ground voltage GND to the channel line 300. According to this bias condition, a surrounding region 300-3B of the channel line 300 neighboring the second word line BWL0 is changed from the polycrystalline state to the amorphous state and thus has the high resistance characteristic. At this time, the surrounding region 300-3B that is changed to the amorphous state comes in touch with the surrounding region 300-3A changed to the amorphous state in FIG. 18 and thus the channel of the channel line 300 is closed in a region corresponding to the word lines TWL0 and BWL0.

Figure 21:
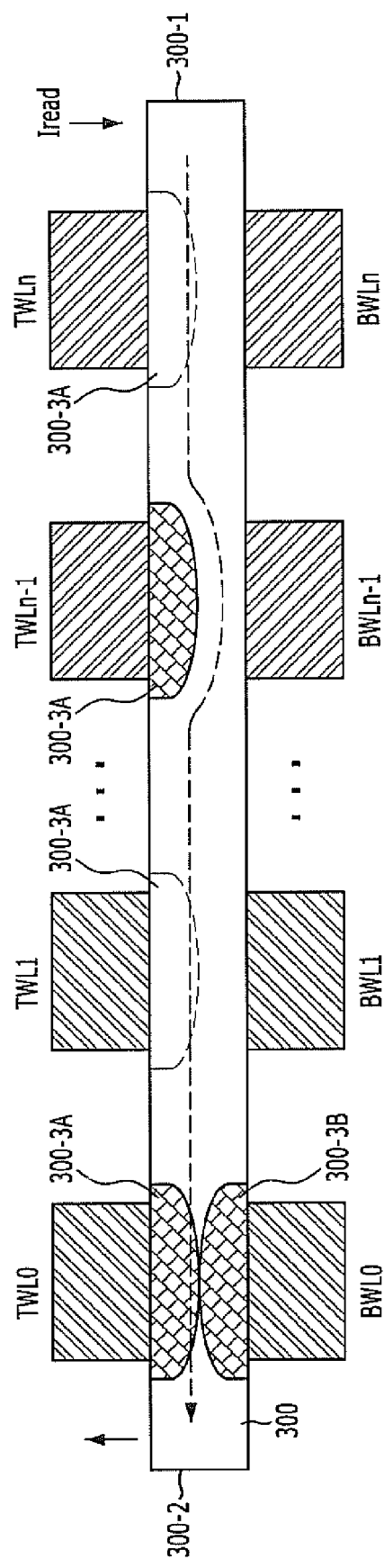

FIG. 21 illustrates a view for explaining a readout method. As illustrated in FIG. 21, the data is read out by supplying the readout current Iread to the first end 300-1 of the channel line 300 from the first page buffer 210 and detecting a current flowing toward the second end 300-2. For instance, the first page buffer 210 supplies the readout current Iread to the channel line 300, and then reads out data '0' in case where the readout Iread flows out through the channel line 300 to the ground terminal connected to the second end 300-2 and data '1' in the other case. In FIG. 21, the channel is completely closed in the state that the surrounding regions 300-3A and 300-3B of the channel region 300 are changed to the amorphous state in FIGS. 19 and 20. Therefore, the current path from the first end 300-1 to the second end 300-2 is blocked and thus the data '1' is read out.

Figure 22:
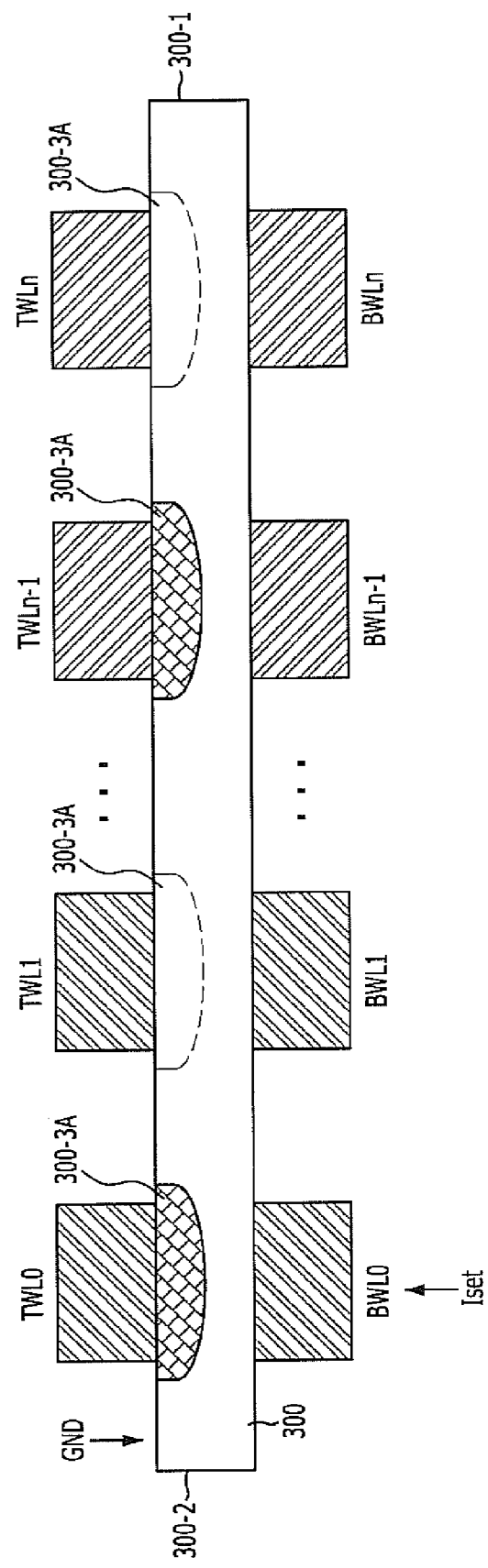

FIG. 22 illustrates a view for explaining a post-readout method. As illustrated in FIG. 22, in the state of supplying the ground voltage GND to the channel line 300, the set current Iset is supplied to the second word line BWL0. According to this bias condition, the surrounding region 300-3B that is in the amorphous state in FIGS. 20 and 21 is changed to the polycrystalline state by the phase transition. That is, through the post-readout operation, the crystalline state of the surrounding region 300-3B is changed to the initial state.

FIGS. 23 to 26 illustrate views for explaining a method for driving the nonvolatile memory device in accordance with the present invention. As just an example, a method for randomly wiring data '0' to the plurality of memory cells constructing the string and reading out the written data is described.

Figure 23:
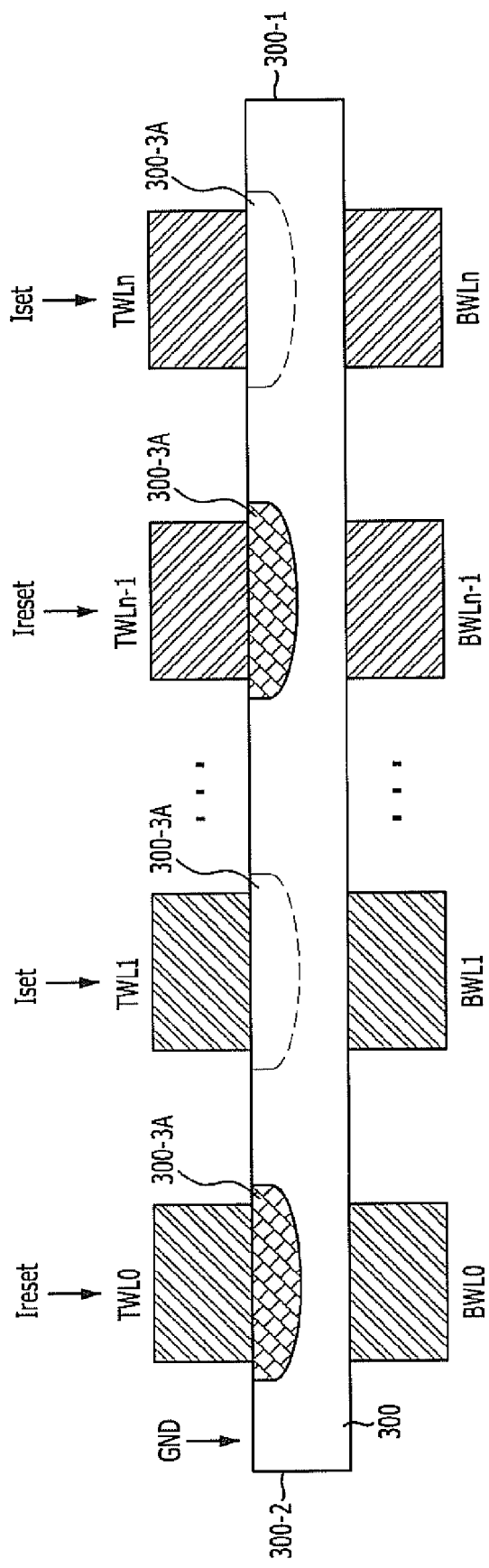

FIG. 23 illustrates the view for explaining the data writing method. As described in FIG. 23, the data writing method is performed in the same manner as that described with reference to FIG. 19. Thus, the phase transition occurs in the surrounding region 300-3A of the channel line 300 neighboring the first word lines TWL0 and TWLn−1 and thus the surrounding region 300-3A of the channel line 300 neighboring the first word lines TWL0 and TWLn−1 is changed from the polycrystalline state to the amorphous state to thereby have the high resistance characteristic. The phase transition does not occur in the surrounding region 300-3A of the channel line 300 neighboring the first word lines TWL1 and TWLn and thus the surrounding region 300-3A of the channel line 300 neighboring the first word lines TWL1 and TWLn maintains its original polycrystalline state to thereby have the low resistance characteristic.

Figure 24:
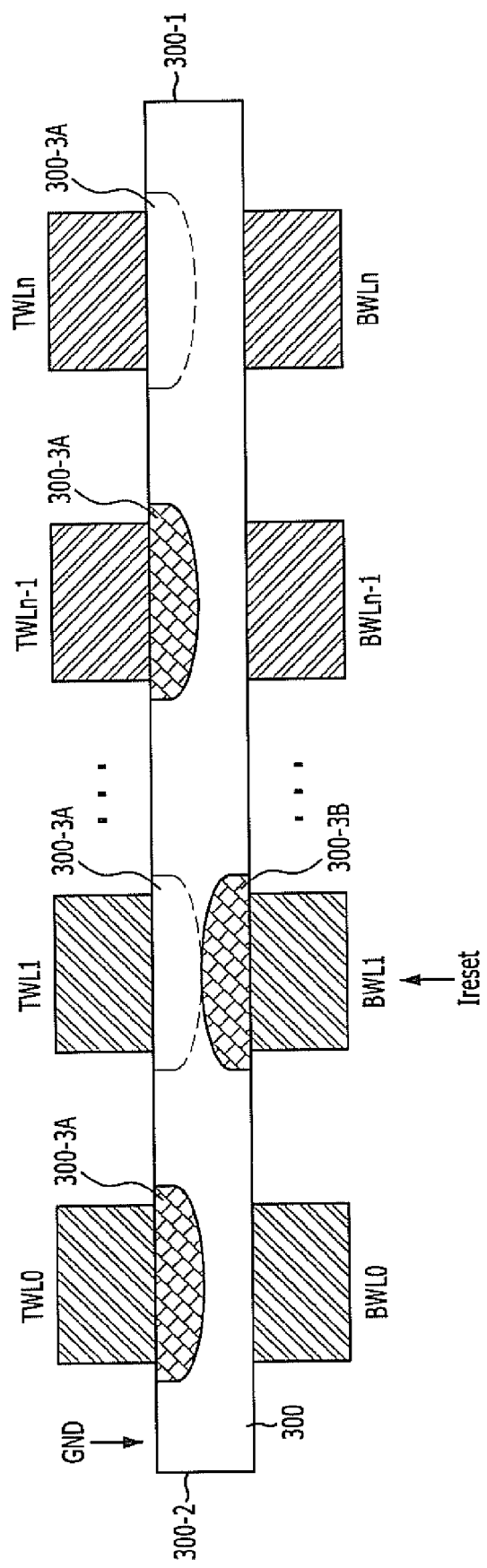

FIG. 24 illustrates a view for explaining a pre-readout method. As an example, a method for pre-reading out data stored in a memory cell corresponding to the first word line TWL1 is described. As illustrated in FIG. 24, the reset current Ireset is supplied to a word line BWL1 among the second word lines BWL0 to BWLn in a state of supplying the ground voltage GND to the channel line 300. According to this bias condition, the surrounding region 300-3B of the channel line 300 neighboring the second word line BWL1 is changed from the polycrystalline state to the amorphous state and thus has the high resistance characteristic. At this time, since the surrounding region 300-3A corresponding to the surrounding region 300-3B that is changed to the amorphous state maintains the polycrystalline state, the channel of the channel line 300 is opened in a region corresponding to the word lines TWL1 and BWL1.

Figure 25:
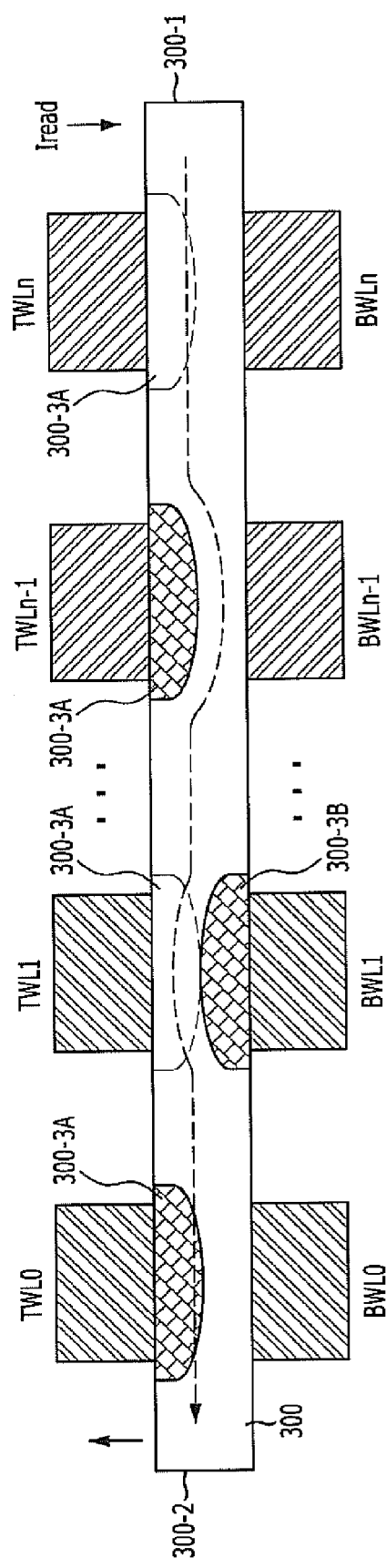

FIG. 25 illustrates a view for explaining a readout method. As illustrated FIG. 25, after supplying the readout current Iread to the channel line 300, the data '0' is read out in case where the readout current Iread flows out through the channel line 300 to the ground terminal connected to the second end 300-2 and the data '1' is read out in other case. Therefore, in FIG. 25, since the channel line 300 is opened in FIGS. 23 and 24, the readout current Iread flows out from the first end 300-1 to the second end 300-2 and thus the first page buffer 210 reads out the data '0'.

Figure 26:
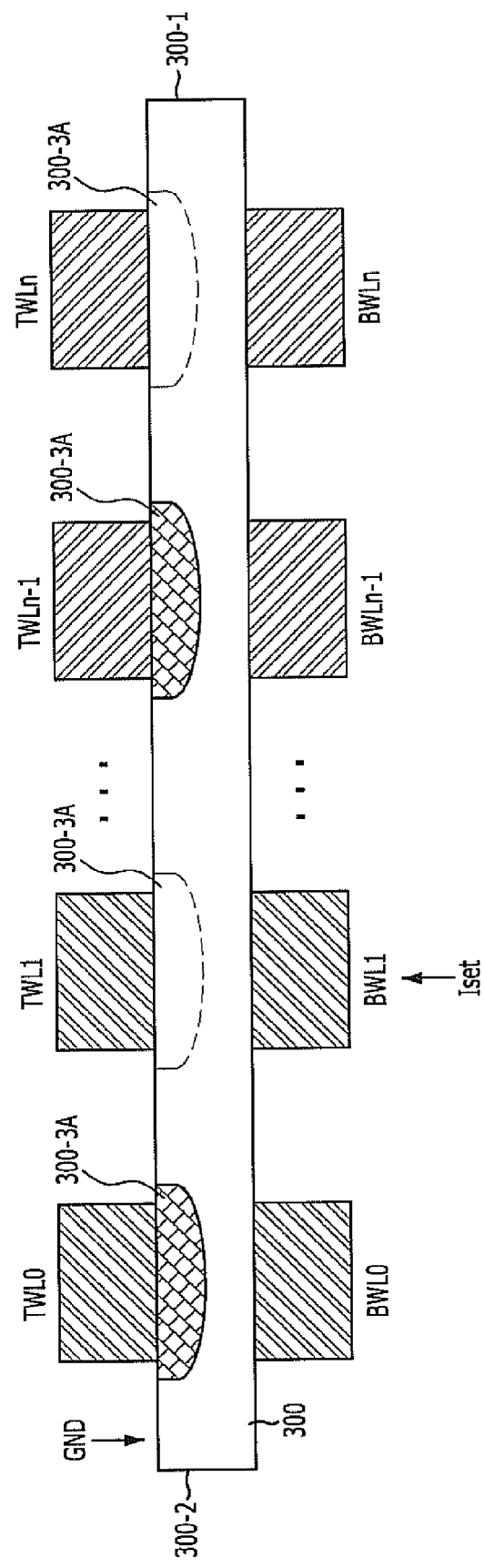

FIG. 26 illustrates a view for explaining a post-readout method. As illustrated in FIG. 26, in the state of supplying the ground voltage GND to the channel line 300, the set current Iset is supplied to the second word line BWL1. According to this bias condition, the surrounding region 300-3B that is in the amorphous state in FIG. 25 is changed to the polycrystalline state by the phase transition.

Figure 27:
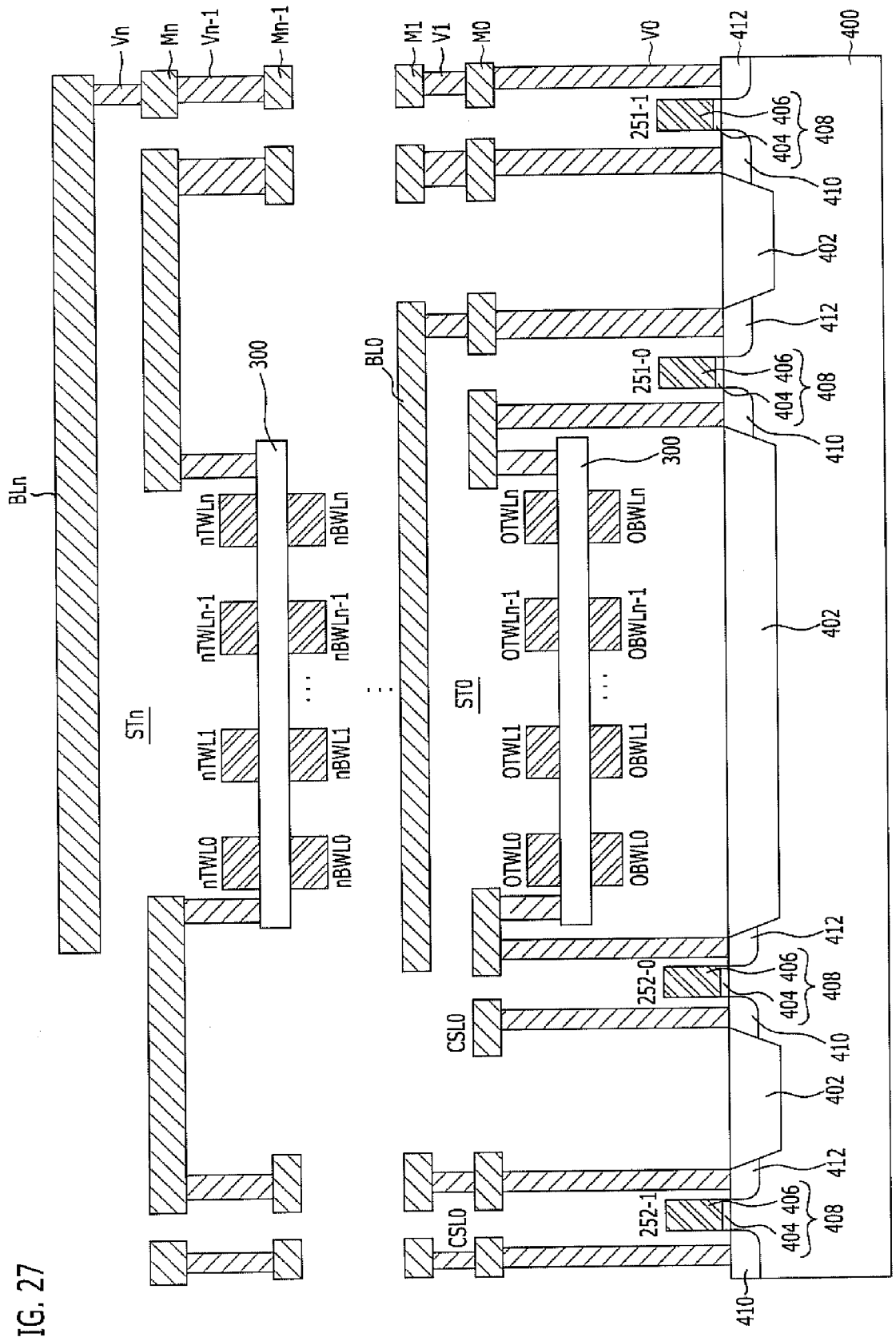
FIG. 27 illustrates a cross-sectional view of the nonvolatile memory device in accordance with the embodiment of the present invention.
Figure 28:
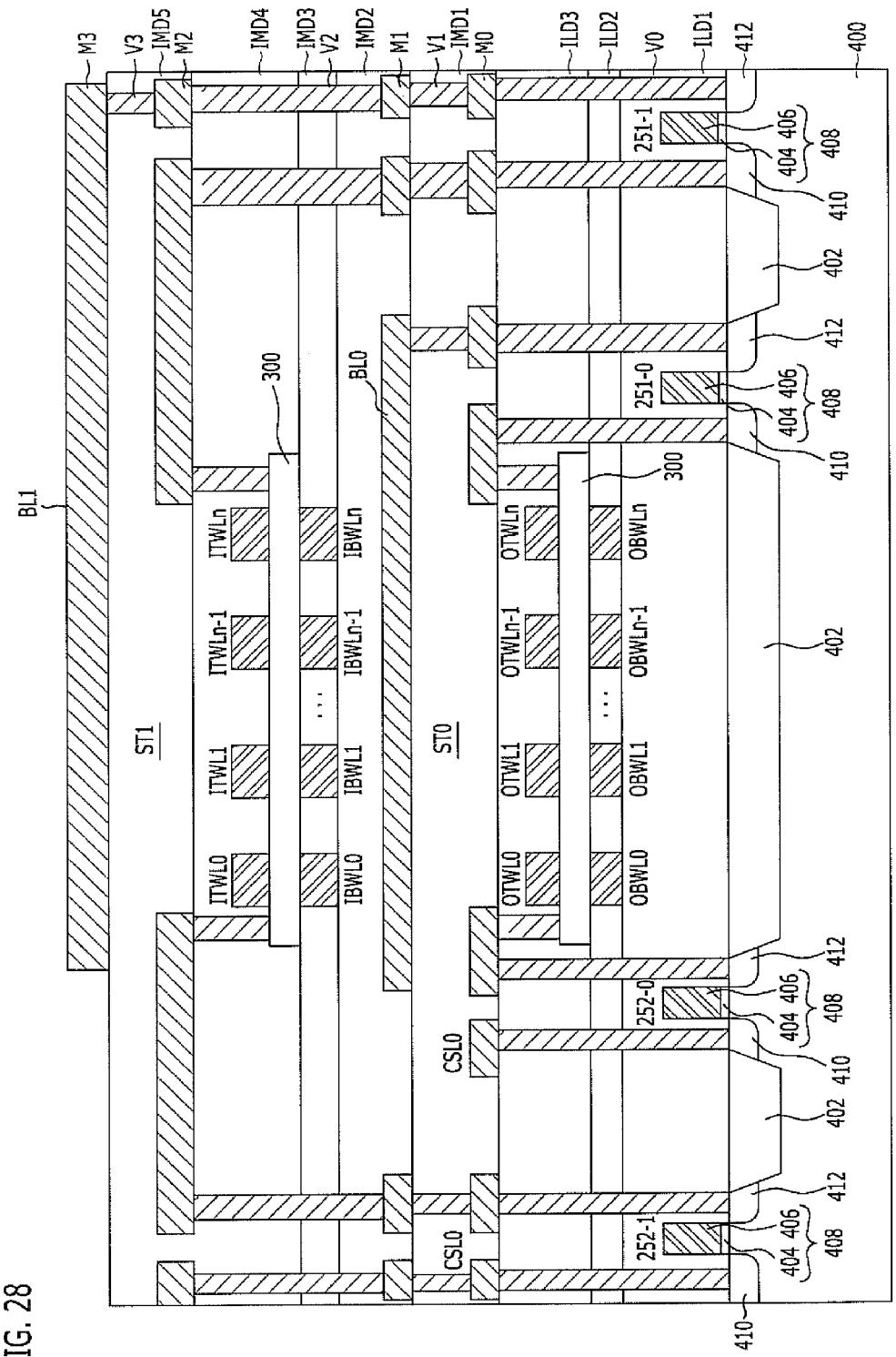
FIG. 28 illustrates a cross-sectional view of a stack structure of strings described in FIG. 27.

FIG. 27 illustrates a cross-sectional view of a nonvolatile memory device in accordance with an embodiment of the present invention. FIG. 28 illustrates a cross-sectional view of a stack structure of strings ST0 and ST1 described in FIG. 27.

Referring to FIGS. 27 and 28, the nonvolatile memory device in accordance with the present invention includes the plurality of blocks Block0 to Blockn as described above with reference to FIG. 16 and the plurality of strings ST0 to STn included in each block is sequentially stacked as shown in the cross-section.

Among components constructing the strings ST0 to STn, components to be stacked are first and second word lines 0TWL0 to nTWLn and 0BWL0 to nBWLn, first and second switching elements 251-0 to 251-n and 252-0 to 252-n are horizontally disposed in series on a substrate 400 without being stacked.

Since the channel line 300 and the first and second word lines 0TWL0 to nTWLn and 0BWL0 to nBWLn do not require active regions based on silicon, they are not to be directly formed on the substrate 400. However, since the first and second switching elements 251-0 to 251-n and 252-0 to 252-n are constructed of transistors, they certainly need the active regions based on the silicon to make the device operate. Thus, since it is difficult to form a stack structure vertically, the first and second switching elements 251-0 to 251-n and 252-0 to 252-n are horizontally disposed in series on the substrate 400 that is a silicon substrate.

Of course, the first and second switching elements 251-0 to 251-n and 252-0 to 252-n may be formed to have a stack structure. In this case, the first and second switching elements 251-0 to 251-n and 252-0 to 252-n may be sequentially formed on the silicon substrate after forming a silicon substrate or a semiconductor layer on each bit line. However, this method makes the fabricating process complicated as well as increasing product costs. Therefore, it is preferable to horizontally dispose the first and second switching elements 251-0 to 251-n and 252-0 to 252-n in series on the substrate 400 without forming the stack structure.

The method for fabricating the nonvolatile memory device in accordance with the embodiment of the present invention is described with reference to FIG. 28. The fabricating method described herein is just an example and thus the nonvolatile memory device in accordance with the present invention can be fabricated using various fabricating methods.

Referring to FIG. 28, an isolation layer 402 is formed in a substrate 400. The isolation layer 402 is formed by performing a shallow trench isolation process. The isolation layer 402 may use a high density plasma layer having a relatively superior filling characteristic.

Then, the first and second switching elements 251-0, 251-1, 252-0 and 252-1 are formed on the substrate 400. Each of the first and second switching elements 251-0, 251-1, 252-0 and 252-1 includes a gate electrode 408 and source and drain regions 410 and 412. The source and drain regions 410 and 412 are formed in portions of the substrate 400 that are exposed at both sides of the gate electrode 408. The gate electrode 408 has a stack structure of a gate insulation layer 404 and a gate conductive layer 406.

A first inter-layer dielectric layer ILD1 is formed on the substrate 400 to cover the first and second switching elements 251-0, 251-1, 252-0 and 252-1. The first inter-layer dielectric layer ILD1 may include a single layer or a stack structure selected from a group comprising a borophosphosilicate glass (BPSG) layer, a phosphosilicate glass (PSG) layer, a fluorinated silicate glass (FSG) layer, a borosilicate glass (BSG) layer, a tetra ethyle ortho silicate (TEOS) layer and a high density plasma (HDP) layer.

The second word lines 0BWL0 to 0BWLn are locally formed on the first inter-layer dielectric layer ILD1. The second word lines 0BWL0 to 0BWLn are formed of a conductive material. The conductive material may include one selected from a group comprising silver (Ag), gold (Au), nickel (NI), platinum (Pt), palladium (Pd), iridium (Ir), rhodium (Rh), tantalum (Ta), tungsten (W), titanium (Ti), molybdenum (Mo), aluminum (Al) and copper (Cu), or an alloy or compound material using the above material as the main ingredient.

After depositing a second inter-layer dielectric layer ILD2 on the second word lines 0BWL0 to 0BWLn, a chemical mechanical polishing (CMP) process is performed to expose the top surface of the second word lines 0BWL0 to 0BWLn.

The channel line 300 formed of germanium-antimony-tellurium (Ge—Sb—Te, GST) that is the chalcogenide compound is formed on the second inter-layer dielectric layer ILD2 to be in contact with the second word lines 0BWL0 to 0BWLn.

The first word lines 0TWL0 to 0TWLn are locally formed on the channel line 300 to correspond to the second word lines 0BWL0 to 0BWLn. The first word lines 0TWL0 to 0TWLn and the second word lines 0BWL0 to 0BWLn may be formed of the same conductive material. Moreover, the first word lines 0TWL0 to 0TWLn and the second word lines 0BWL0 to 0BWLn may be formed to have the same size.

After forming a third inter-layer dielectric layer ILD3 to cover the first word lines 0TWL0 to 0TWLn and the channel line 300 and etching the third inter-layer dielectric layer ILD3, first via contacts V0 are formed by filling the etched parts of the third inter-layer dielectric layer ILD3. Some of the first via contacts V0 are connected to the channel line 300 and some of the first via contacts V0 are connected to the source and drain regions 410 and 412 of the first and second switching elements 251-0, 251-1, 252-0 and 252-1.

First metal lines MO are formed on the third inter-layer dielectric layer ILD3 to be connected with the first via contacts V0. The first metal line MO is formed of a conductive material. The conductive material may include one selected from a group comprising silver (Ag), gold (Au), nickel (Ni), platinum (Pt), palladium (Pd), iridium (Ir), rhodium (Rh), tantalum (Ta), tungsten (W), titanium (Ti), molybdenum (Mo), aluminum (Al) and copper (Cu), or an alloy or compound material using the above material as the main ingredient.

A first inter-metal dielectric layer IMD1 is formed on the third inter-layer dielectric layer ILD3 to cover the first metal lines MO. Then, after etching the first inter-metal dielectric layer IMD1, second via contacts V1 are formed in the etched parts of the inter-metal dielectric layer IMD1 to be connected to the first metal lines MO.

Second metal lines M1 are locally formed on the first inter-metal dielectric layers IMD1 to be connected to the second via contacts V1. Some of the second metal lines M1 act as a bit line BL0.

After forming a second inter-metal dielectric layer IMD2 to cover the second metal lines M1, second word lines 1BWL0 to 1BWLn constructing the next string ST1 are locally formed on the second inter-metal dielectric layer IMD2.

After forming a third inter-metal dielectric layer IMD3 to expose the top surface of the second word lines 1BWL0 to 1BWLn, the channel line 300 that is in contact with the second word lines 1BWL0 to 1BWLn is formed on a resultant structure including the third inter-metal dielectric layer IMD3.

After locally forming first word lines 1TWL0 to 1TWLn on the channel line 300, a fourth inter-metal dielectric layer IMD4 is formed to cover the channel line 300 and the first word lines 1TWL0 to 1TWLn.

After sequentially etching the fourth inter-metal dielectric layer IMD4, the third inter-metal dielectric layer IMD3 and the second inter-metal dielectric layer IMD2, third via contacts V2 are formed in the etched parts of the fourth inter-metal dielectric layer IMD4, the third inter-metal dielectric layer IMD3 and the second inter-metal dielectric layer IMD2. Some of the third via contacts V2 are connected to the second metal lines M1 to be electrically connected to the source and drain regions 410 and 412 of the first and second switching elements 251-1 and 252-1 that are formed under the third via contacts V2. Moreover, the remaining third via contacts V2 are connected to the channel line 300 of the string ST1.

After forming third metal lines M2 on the fourth inter-metal dielectric layer IMD4 to be connected with the third via contacts V2, a fifth inter-metal dielectric layer IMD5 is formed to cover the third metal lines M2.

After forming fourth via contacts V3 connected to the third metal lines M2 by etching the fifth inter-metal dielectric layer IMD5, fourth metal lines M3 are formed on the fifth inter-metal dielectric layer IMD5 to be connected to the fourth via contacts V3. Some of the fourth metal lines M3 act as a bit line BL1.

Although, for illustration purposes, the method for fabricating the strings ST0 and ST1 is described above, the nonvolatile memory device having the stack structure where the plurality of strings is vertically stacked as shown in FIG. 27 may be fabricated in the same manner.

In FIG. 27, even if the first and second switching elements 251-0 to 251-$n$ and 252-0 to 252-$n$ are horizontally disposed around the channel line 300 without overlapping with the channel line 300, that is just an example, they may be formed in an empty space under the channel line 300. That is, it is possible to further reduce a layout area by disposing the first and second switching elements 251-0 to 251-$n$ and 252-0 to 252-$n$ under the channel line 300 to overlap with the channel line 300.

As described above, in accordance with the embodiments of the present invention, it is possible to obtain following effects.

Firstly, since there is provided the nonvolatile memory cell including the dual gate structure that uses the chalcogenide compound for the channel, it is possible to reduce the size for each unit area of the nonvolatile memory cell by as much as the size of a via contact since there is no need to form the via contact for connecting a transistor and a phase-change layer compared to the conventional nonvolatile memory cell constructed of the transistor and the phase-change layer.

Secondly, since there is provided the nonvolatile memory device including the nonvolatile memory cell having the dual gate structure that uses the chalcogenide compound for the channel, it is possible to improve a degree of integration compared to a memory device including the conventional nonvolatile memory cell.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device, comprising:
a channel line formed of a phase-change material; and
a plurality of first word lines and a plurality of second word lines that are formed on a channel line to face each other across the channel line and control a current flowing through the channel line by each word line being arranged to induce the phase transition in surrounding regions of the channel line independently of other word lines, wherein the first and second word lines are formed on the channel line in the surrounding regions.

2. The nonvolatile memory device of claim 1, wherein the first word lines are formed on one side of the channel line and are each arranged to change a crystalline state of a first surrounding region of the channel line using heat generated by a current supplied thereto so that the first surrounding region has a high or low resistance characteristic, wherein the first word lines are formed on the first surrounding region of the channel line.

3. The nonvolatile memory device of claim 1, wherein the second word lines are formed on the other side of the channel line and are arranged to change a crystalline state of a second surrounding region of the channel line using heat generated by a current supplied thereto so that the second surrounding region has a high or low resistance characteristic, wherein the second word lines are formed on the second surrounding region of the channel line.

4. The nonvolatile memory device of claim 1, further comprising:
 a bit line;
 a common source line;
 a first switching element connecting the bit line with a first end of the channel line; and
 a second switching element connecting the common source line with a second end of the channel line.

5. The nonvolatile memory device of claim 4, wherein the first and second switching elements are constructed of transistors.

6. The nonvolatile memory device of claim 4, further comprising a page buffer configured to detect a current flowing through the channel line from the bit line, wherein the channel line is connected to the bit line through the first switching element.

7. The nonvolatile memory device of claim 6, wherein the page buffer is connected to two bit lines that neighbor each other.

8. The nonvolatile memory device of claim 4, wherein the bit line is disposed in a direction running parallel with the channel line.

9. The nonvolatile memory device of claim 4, wherein the common source line is disposed perpendicular to the bit line and connected to a ground terminal.

10. The nonvolatile memory device of claim 4, wherein the common source line is connected to a plurality of channel lines through a plurality of second switching elements.

11. The nonvolatile memory device of claim 4, further comprising a first and a second row decoder configured to supply a reset current or a set current to the first and second word lines.

12. A method for driving a nonvolatile memory device, the method comprising:
 a data writing step of writing data by supplying a reset current or a set current to a selected first word line;
 a pre-readout step of supplying the reset current to a second word line facing to the selected first word line; and
 a readout step of reading out the data by supplying a readout current to a bit line connected to a channel line.

13. The method of claim 12, after the readout step, further comprising a post-readout step of supplying the set current to the second word line.

14. The method of claim 13, wherein, in the post-readout step, a surrounding region of the channel line that is in contact with the second word line is changed from a polycrystalline state to an amorphous state.

15. The method of claim 13, wherein, in the data writing step, the pre-readout step and the post-readout step, a ground voltage is supplied to the channel line.

16. The method of claim 12, wherein, in the data writing step, data having a logic value '1' is written in case where the reset current is supplied.

17. The method of claim 12, wherein, in the data writing step, data having a logic value '0' is written in case where the set current is supplied.

18. The method of claim 12, wherein, in the data writing step, a surrounding region of the channel line that is in contact with the first word line is changed from a polycrystalline state to an amorphous state in case where the reset current is supplied.

19. The method of claim 12, wherein, in the data writing step, a surrounding region of the channel line that is in contact with the first word line is changed to a polycrystalline state in case where the set current is supplied.

20. The method of claim 12, wherein, in the pre-readout step, a surrounding region of the channel line that is in contact with the second word line is changed from a polycrystalline state to an amorphous state in case where the reset current is supplied.

* * * * *